US 6,799,901 B2
(12) United States Patent
Yoshimura et al.

(10) Patent No.: US 6,799,901 B2
(45) Date of Patent: Oct. 5, 2004

(54) OPTICAL SEMICONDUCTOR MODULE

(75) Inventors: Manabu Yoshimura, Yokohama (JP); Kazunori Yoshida, Osaka (JP); Masaki Furumai, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 14 days.

(21) Appl. No.: 09/913,160

(22) PCT Filed: Dec. 11, 2000

(86) PCT No.: PCT/JP00/08741
§ 371 (c)(1),
(2), (4) Date: Nov. 3, 2001

(87) PCT Pub. No.: WO01/43245
PCT Pub. Date: Jun. 14, 2001

(65) Prior Publication Data
US 2002/0164131 A1 Nov. 7, 2002

(30) Foreign Application Priority Data
Dec. 10, 1999 (JP) .......................................... 11-351805

(51) Int. Cl.[7] .............................................. C02B 6/42
(52) U.S. Cl. .............................. 385/88; 385/92; 385/93
(58) Field of Search ............................... 385/88, 92, 93

(56) References Cited

U.S. PATENT DOCUMENTS

| 5,073,047 A | * | 12/1991 | Suzuki et al. | 385/93 |
| 5,127,074 A | * | 6/1992 | Watanabe et al. | 385/93 |
| 5,315,680 A | * | 5/1994 | Musk et al. | 385/88 |
| 5,388,171 A | * | 2/1995 | Michikoshi et al. | 385/36 |
| 5,452,389 A |   | 9/1995 | Tonai et al. |  |
| 5,661,834 A | * | 8/1997 | Watanabe et al. | 385/92 |
| 5,751,878 A | * | 5/1998 | Kyoya | 385/93 |
| 5,815,623 A | * | 9/1998 | Gilliland et al. | 385/93 |
| 5,841,924 A | * | 11/1998 | Mugiya et al. | 385/93 |
| 5,859,944 A | * | 1/1999 | Inoue et al. | 385/73 |
| 6,123,465 A | * | 9/2000 | Hashizume | 385/93 |
| 6,244,754 B1 | * | 6/2001 | Takagi et al. | 385/88 |
| 6,409,398 B2 | * | 6/2002 | Nakaya et al. | 385/93 |
| 6,425,696 B1 | * | 7/2002 | Peterson et al. | 385/92 |
| 6,517,258 B1 | * | 2/2003 | Keska et al. | 385/92 |

FOREIGN PATENT DOCUMENTS

| EP | 0441001 | 8/1991 |
| JP | 2-281217 | 11/1990 |
| JP | 4-81107 | 7/1992 |
| JP | 6-174980 | 6/1994 |
| JP | 9-43457 | 1/1997 |
| JP | 9-43457 | 2/1997 |
| JP | 10-247740 | 9/1998 |
| JP | 11-52199 | 2/1999 |

* cited by examiner

Primary Examiner—John D. Lee
Assistant Examiner—Tina M. Lin
(74) Attorney, Agent, or Firm—Smith, Gambrell & Russell, LLP

(57) ABSTRACT

An optical semiconductor module with a downsizeable structure is provided. An optical semiconductor module 10 comprises a mounting member 20, first member 30, optical semiconductor element 22, second member 34, and optical fiber 40. The mounting member 20 extends along a reference surface intersecting an axis 12. The first member 30 has a tubular portion 30a extending in a direction of the axis 12, a first end 30b formed at one end of the tubular portion 30a and fixed to the mounting member, and a second end 30c formed at the other end of the tubular portion 30a. The optical semiconductor element 22 is arranged in the tubular portion 30a of the first member 30 such that its optical axis is directed in a direction of the predetermined axis 12. The second member 34 has a tubular portion 34a extending in a direction of the axis 12, and is fixed to the second end 30c of the first member 20. The optical fiber 40 extends in the tubular portion 34a of the second member 34 such that it is optically coupled to the optical semiconductor element 22.

14 Claims, 6 Drawing Sheets

OPTICAL SEMICONDUCTOR MODULE

TECHNICAL FIELD

The present invention relates to an optical semiconductor module.

BACKGROUND ART

A conventional optical semiconductor module 100 has a TO type CAN case 102, light-emitting element 104, optical fiber 106, ferrule 108, and support member 110. The light-emitting element 104 is accommodated in the case 102. The optical fiber 106 is optically coupled to the light-emitting element 104. The ferrule 108 supports the optical fiber 106. The support member 110 supports the ferrule 108. The support member 110 has a cylindrical shape extending in a direction along the optical axis of the light-emitting element 104, and is fixed to the side surface of the CAN case 102 through adhesive 112. This configuration enables the optical fiber 106 to optically couple to the light-emitting element 104.

DISCLOSURE OF THE INVENTION

The inventor has made studies for developing a smaller version of an optical semiconductor module. As the result of these studies, the inventor found a demand for decreasing the cross sectional area of the optical semiconductor module in a surface perpendicular to the optical axis particularly in this technical field.

It is, therefore, an object of the present invention to provide an optical semiconductor module having a structure allowing the above downsizing.

The inventor made further studies in order to realize this object.

First, the inventor made studies on the roles of components composing the conventional optical semiconductor module. The TO type CAN case accommodates an optical semiconductor element, such as a semiconductor laser or a semiconductor light-receiving element. A support member serves to optically couple an optical fiber to this semiconductor light-emitting element or semiconductor light-receiving element. The support member has an insertion hole for defining a direction in which a ferrule holding the optical fiber is inserted. The direction of the ferrule is determined by the angle at which the CAN case is inserted in the insertion hole of the support member. In the support member, the inner diameter of the cylindrical portion is determined to be associated with the outer diameter of the CAN case. This structure enables the optical fiber to coincide with the optical axis of the light-emitting element when the support member is aligned with the CAN case.

Subsequently, in the optical semiconductor module with components exhibiting these roles, the inventor made studies on the shape of the optical semiconductor module in a cross section perpendicular to the optical axis. The inventor found as follows: the support member has a portion accommodating the CAN case inserted thereto. It is difficult to reduce the cross section of this portion in the optical semiconductor module as compared to the others of the optical semiconductor module. Therefore, what is needed is to reduce the cross sectional area of this portion in the optical semiconductor module.

The inventor continued the studies on a structure that implements the reduction, and eventually invented the following.

An optical semiconductor module according to the present invention comprises a mounting member, a first member, an optical semiconductor element, a second member, and an optical waveguide. The mounting member extends along a reference plain intersecting a predetermined axis. The first member has a tubular portion, first and second ends, said tubular portion extending in a direction of the predetermined axis, a first end being provided at one end of the tubular portion, and a second end being provided at the other end of the tubular portion. The first end is secured to the mounting member. The optical semiconductor element is arranged in the tubular portion of the first member such that its optical axis extends in a direction of the predetermined axis. The second member has a tubular portion extending in a direction of the predetermined axis, and is secured to the second end of the first member. The optical waveguide is provided to pass through in the tubular portion of the second member such that it is optically coupled to the optical semiconductor element.

Since the first member is secured to the mounting member, the mounting member and first member define a space for accommodating the optical semiconductor element. The second member defines a direction in which the optical waveguide extends. The second member is secured to the second end of the first member. This securing determines the direction in which the optical semiconductor element can be optically coupled to the optical waveguide.

Since the mounting member and first member define the accommodating space for the optical semiconductor element, this configuration does not need any support member surrounding a CAN case therewith as in the conventional optical semiconductor module. Therefore, the optical semiconductor module is provided with a structure enabling the downsizing thereof.

In the present invention, one or more features that will be described below can be combined with each other arbitrarily.

The optical semiconductor module according to the present invention can further comprise a ferrule. The ferrule can be arranged in the tubular portion of the second member, and can be secured thereto. The optical waveguide may include an optical fiber supported by the ferrule.

The ferrule is guided by the tubular portion, and is arranged in the tubular portion of the second member while supporting the optical fiber. This configuration enables the optical fiber to be optically coupled to the optical semiconductor element. Since the ferrule is secured to the second member, the optical coupling becomes stabilized.

The optical semiconductor module according to the present invention further comprises a third member having a tubular portion and a pair of openings. The tubular portion of the third member extends in a direction of the predetermined axis, and accommodates the second member and the ferrule. The openings are arranged at two ends of the tubular portion. The optical fiber passes through one opening of the pair of openings to the ferrule.

The second member and ferrule are arranged in the tubular portion of the third member, and are protected by the tubular portion. Since the optical fiber passes through one opening of the pair of openings, the third member guides the optical fiber so as to extend toward the ferrule, thereby defining a range in which the optical fiber can be bent. This structure suppresses an unexpected force from being applied to the optical fiber at a position where the optical fiber is inserted in the ferrule.

In the optical semiconductor module according to the present invention, the ferrule has first and second end faces.

The optical fiber can be arranged to extend from the first end face toward the second end face of the ferrule. The ends of the optical fiber appear at both the first and second end faces, respectively. Hence, one of the first and second end faces can be optically coupled to the optical semiconductor element. The other one of the first and second end faces can be optically coupled to another optical fiber.

The optical semiconductor module according to the present invention further comprises a sleeve in which the ferrule is inserted. The second member has a depressed portion provided in an inner wall surface of the tubular portion. The sleeve can be arranged in the depressed portion of the second member.

The sleeve is accommodated in the depressed portion provided in a predetermined position of the second member, thereby determining the position of the ferrule.

In the optical semiconductor module according to the present invention, the tubular portion of the second member has first and second portions adjacent to each other in a direction of the predetermined axis. The first portion accommodates the ferrule. The second portion is provided so as to arrange another ferrule. Another ferrule holds another optical fiber that should be optically coupled to the optical fiber. When the other ferrule is inserted in the second member, the other optical fiber is optically coupled to the optical semiconductor element. The inner wall surface of the tubular portion guides the other optical fiber which is being inserted, and the sleeve enables the optical alignment of the other optical fiber.

The optical semiconductor module according to the present invention further comprises a lens provided between the optical waveguide and the optical semiconductor element. This lens enables the optical tight coupling between the optical semiconductor element and the optical waveguide.

In the optical semiconductor module according to the present invention, the optical semiconductor element can be either one of a light-emitting element and a light-receiving element. If the optical semiconductor element is a light-emitting element, it can provide an optical signal to the optical fiber. If the optical semiconductor element is a light-receiving element, it can receive the optical signal from the optical fiber and convert it into an electrical signal.

In the optical semiconductor module according to the present invention, the first member is secured to the mounting member at an annular connecting portion. The annular connecting portion is so formed as to surround a straight line on the optical axis of the optical semiconductor element. Since the annular connecting portion is provided to be highly symmetric with respect to the optical axis, it averages displacement of the first member in securing it.

In the optical semiconductor module according to the present invention, the mounting member can be included in a cylindrical shape, having the center axis perpendicular to the reference surface and a cross section having a diameter of 4 mm or less. With the structures of the optical semiconductor module that has been already described in this specification and will be described hereinafter, optical semiconductor modules that can be accommodated in a cylindrical shape with a diameter of 4 mm or less can be realized.

BRIEF DESCRIPTION OF DRAWINGS

The above and other objects, features and advantages of the present invention will be readily apparent from the following detailed description of the preferred embodiments of the present invention which will be made with reference to the following accompanying drawings.

BEST MODES FOR CARRYING OUT THE INVENTION

Figure 1:
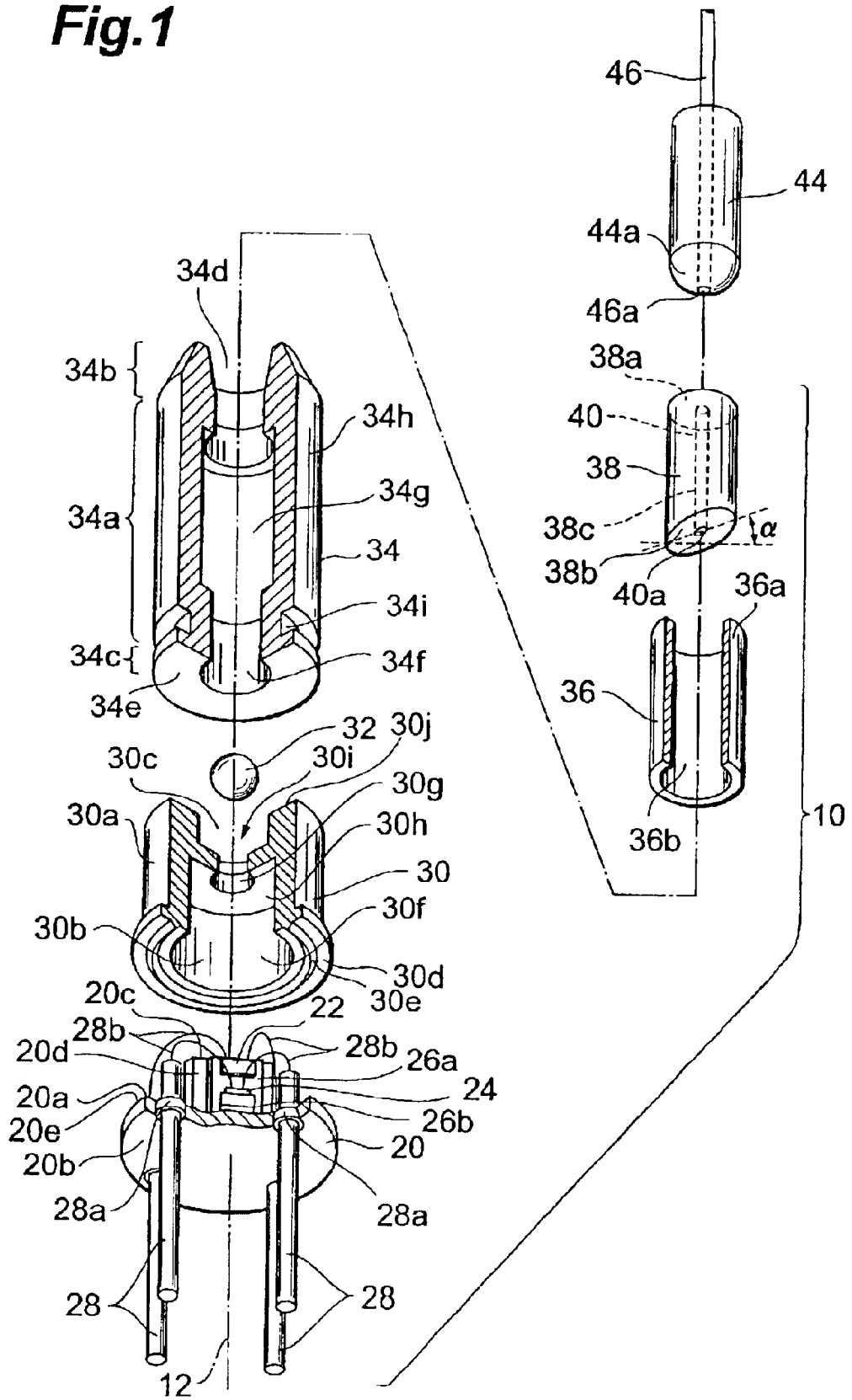
FIG. 1 is a perspective view of an optical semiconductor module according to the first embodiment of the present invention.

The teachings of the present invention can be easily understood in consideration of the following detailed description with reference to the accompanying drawings. In the drawings, the same elements are denoted by the same reference numerals, if possible (First Embodiment)

An optical semiconductor module 10 according to an embodiment of the present invention will be described with reference to FIGS. 1 and 2. The optical semiconductor module 10 has a mounting member 20, an optical semiconductor element 22, a first member 30, second member 34, and an optical waveguide 40. The optical semiconductor module 10 also has condenser means, such as a lens 32, provided between the optical semiconductor element 22 and optical waveguide 40. The optical semiconductor module 10 has a sleeve 36 and a ferrule 38, and the ferrule 38 is inserted in the sleeve 36. The sleeve 36 and ferrule 38 can be accommodated in the second member 34, and the optical waveguide 40 contains an optical fiber held by the ferrule 38.

In the optical semiconductor module 10, the following components are arranged in a direction of an axis 12: the mounting member 20, the optical semiconductor element 22, the first member 30, the lens 32, the second member 34, the sleeve 36, the ferrule 38, and the optical waveguide 40. The predetermined axis can be selected to coincide with an optical axis associated with the optical semiconductor element 22. The following description will be made for an optical semiconductor module having an optical fiber adopted as the optical waveguide. In the embodiment, the optical fiber is an optical waveguide with a core and a cladding provided around the core. A coated optical fiber is an optical waveguide covered with a resin, and the coated optical fiber has a diameter of about 250 μm. The coating resin is stripped-off in a part of the coated optical fiber such that the stripped-off part can be inserted in the ferrule.

The mounting member 20 can be a plate-like member, e.g., a metallic member processed by plating an iron member with gold, extending along a reference plane intersecting the predetermined axis 12. The mounting member 20 has a element mounting surface 20a and a terminal arranging surface 20b both extending along the reference plain. The element mounting surface 20a has a support projection 20c extending in a direction of the predetermined axis 12. The support projection 20c has a support surface 20d for mounting the optical semiconductor element 22 thereon, and the support surface 20d extends in a direction of the predetermined axis 12. The optical semiconductor element 22, such as a light-receiving element and light-emitting element, is arranged on the support surface 20d.

FIG. 1 exemplifies the optical semiconductor module 10 employing the optical semiconductor element 22, such as a semiconductor laser element, but an optical semiconductor element 22, such as a light-emitting diode, can be also employed. A Fabry-Perot type laser diode or DFB type laser diode each having a multiple quantum well structure constituted by InGaAsP/InP can be employed as a semiconductor laser element of the 1.3 μm band. As a semiconductor laser element with a wavelength in the 1.55 μm band, a Fabry-Perot type laser diode or DFB type laser diode each having a multiple quantum well structure constituted by InGaAsP/InP can be employed. Alternatively, a light-receiving element such as a surface light-receiving photodiode can be also used in place of the light-emitting element if it is arranged such that its optical axis can be aligned with the optical fiber. In this case, the light-receiving surface of the light-receiving element intersects the predetermined axis 12 at a predetermined angle, e.g., a right angle.

In accordance with an example shown in FIG. 1, an optical semiconductor module including a semiconductor laser as the optical semiconductor element 22 will be described. The optical semiconductor element 22 has a light-emitting surface and light-reflecting surface so as to form an optical cavity, and is arranged on a mounting component made of insulating material 26a, e.g., a heat sink or submount, such that its light-emitting surface and light-reflecting surface intersect the predetermined axis 12. A monitoring light-receiving element 24 is arranged on a mounting component made of insulating material 26b, e.g., a submount, such that c is faced with the light-reflecting surface, i.e., the light-receiving surface intersects the predetermined axis. Hence, an electrical signal available for monitoring the operation state of the optical semiconductor element 22 is supplied from the monitoring light-receiving element 24, such as a surface light-emitting photodiode. The mounting component 26b is secured on the mounting component 26a.

The terminal arranging surface 20b has one or more terminal electrodes 28, e.g., four terminal electrodes 28 in this embodiment. The terminal electrodes 28 extend in a direction of the predetermined axis 12, and are inserted in holes extending from the element mounting surface 20a to the terminal arranging surface 20b. The terminal electrodes 28 have outer terminal portions projecting from the terminal arranging surface 20b, and inner terminal portions projecting from the element mounting surface 20a. The light-emitting element 22 and light-receiving element 24 are electrically connected to the inner terminal portions through the connecting members 28, such as bonding wires. The terminal electrodes 28 are secured to the mounting member 20 through insulating members 28a. The insulating members 28a electrically isolate the terminal electrodes 28 from the mounting member 20. The terminal electrode 28 is also secured to the mounting member 20 without the insulating members 28a, whereby this terminal electrode 28 is electrically connected to mounting member 20. Therefore, the mounting member 20 and second member 30 are grounded in this embodiment while the optical semiconductor module 10 operates.

The first member 30 has a tubular portion 30a, first end portion 30b, and second end portion 30c. The tubular portion 30a extends along the predetermined axis 12. The first end portion 30b is formed at one end of the tubular portion 30a. The second end portion 30c is formed at the other end of the tubular portion 30a. The first member 30 can be made of a metal, such as stainless steel. The first end portion 30b has a fixing surface 30d that comes into contact with the mounting member. The fixing surface 30d has a projection 30e provided so as to surround the axis 12. The first member 30 is joined with the mounting member 20 such that the fixing surface 30d faces a contact surface 20e of the mounting member 20. For example, this fixing can be performed in the following manner. The first member 30 is arranged on the mounting member 20 such that the annular projection 30e comes into contact with the contact surface 20e. A current exceeding a predetermined value is applied through the mounting member 20 and first member 30. Since this current is concentrated at the annular projection 30e, Joule heat is generated mainly at this projection to heat it. When this temperature at the projection exceeds the melting point, the annular projection 30e is melted. Because of this melting, the mounting member 20 is welded to the first member 30. The continuous welded portion is formed by this securing, so that the hermetical sealing is obtained at this bonding portion and the mounting member 20 is electrically connected to the first member 30. The mounting member 20 and first member 30 can be grounded through a terminal electrode 28. This terminal electrode 28 is electrically connected to the mounting member 20 without the insulating members 28a.

The tubular portion 30a has an inner wall surface 30f extending in the direction of the predetermined axis 12. The inner wall surface 30f has an annular projection 30h provided so as to support the lens 32. The projection 30h extend so as to forms a lens arranging hole 30i defined by a retaining surface 30g surrounding the axis 12. The lens 32 is accommodated in the lens arranging hole 30i, and is bonded to the first member 30 through an adhering member 42, such as an ultraviolet-curing resin or thermosetting resin. The adhering member 42 is annularly formed such that the lens 32 can adhere to retaining surface 30g. The shape of the adhering member 42 is ensures the hermetical sealing at the adhering portion. The second end portion 30c has an end face 30j for supporting the second member 34. The lens arranging hole 30i can position the lens 32. The lens 30 bonded faces the light-emitting surface of the optical semiconductor element 22.

When the first member 30 is placed on the mounting member 20, the parts mounting surface 20a, inner wall surface 30f, and projection 30g define a space where the optical semiconductor element 22 is to be accommodated. Hence, the first member 30 serves as a housing or accommodating member. The annular projection 30e and adhering member 42 allows the hermetical sealing of the accommodating space, and the optical module has a structure that does not contain a TO type CAN case, so that the optical module becomes smaller in size.

The second member 34 has a tubular portion 34a extending in the direction of the predetermined axis 12. The second member 34 can be made of a metal, such as stainless steel. The tubular portion 34a has an opening for inserting the sleeve 36 and ferrule 38 at one end 34b thereof. Thus, the end portion 34b has a taper surface 34d. The tubular portion 34a also has an opening on the other end 34c through which light from the optical semiconductor element 22 passes.

The second member 34 has a fixing surface 34e provided so as to face the second end face 30j of the first member 30. The second member 34 is aligned with the first member 30 to ensure the introduction of the light. The second member 34 is joined to the first member 30 at the outer surface of the fixing surface 34e. This securing of the second member 34 is achieved by a plurality of portions 48a and 48b (see FIG. 2). This securing is carried out at these positions by a YAG laser beam, for example. The securing portions formed by laser welding are arranged highly symmetrically. These symmetrical securing portions reduce distortion that may be caused by securing. This structure allows the optical coupling of the optical fiber 40 to optical semiconductor element 22 without degradation of the optical coupling.

The second member 34 has an inner wall surface 34f extending in the direction of along the axis 12. The inner wall surface 34f defines a region for accommodating the sleeve 36 and ferrule 38, and a direction in which the sleeve 36 and ferrule 38 are guided. The inner wall surface 34f has a depressed portion 34g for accommodating the sleeve 36. The depressed portion 34g is provided so as to form a closed loop about the axis 12. The depressed portion 34g can be a depression having a width and a depth determined such that the sleeve 36 is accommodated.

As the second member 34 is a cylindrical member, a sleeve 36, such as a split sleeve is preferably arranged in the depressed portion 34g. The sleeve 36 shown in FIG. 1 is a split sleeve, and has a tubular portion 36a and gap 36b. The tubular portion 36a has a shape of a circular columnar shell extending in a direction of a predetermined axis. The gap 36b forms a pair of edges extending in a direction of the predetermined axis in the tubular portion 36a. Hence, the split sleeve is inserted in the depressed portion 34g of the second member 34 such that the distance of the gap 36b, i.e., the interval of the edges, is decreased. After the split sleeve has inserted therein, the reduced gap 36b is relieved, so the outer surface of the sleeve 36 comes into contact with the wall surface of the recess 34g, thereby fixing the position of the sleeve 36.

The second member 34 has an outer wall depressed portion 34i in its outer wall surface 34h. This depressed portion 34i forms a flange on the second terminal 34c. The outer wall depressed portion 34i has a surface 34m extending along the fixing surface 34e. When the outer wall depressed portion 34i is irradiated with the YAG laser at a plurality of positions, the second member 34 and first member 30 can be welded to each other at the welded portions 48a and 48b (see FIG. 2). The outer wall depressed portion 34i is used to facilitate the securing of the second member 34 and first member 30 to the fixing surface 34e after the second member 34 and first member 30 are aligned. When this embodiment is employed, the plurality of fixing portions 48a and 48b can be formed simultaneously.

The ferrule 38 is accommodated in the sleeve 36, and the ferrule 38 is positioned in the first member 30 by the fastening force of the sleeve 36. Alternatively, the ferrule 38 may be secured to the sleeve 36 by welding, for example. The position of the ferrule 38 is secured to the first member 30, whereby this securing ensues optical coupling between one end 40a of the optical fiber 40 and the lens 32. The position of the ferrule 38 can be changed in accordance with the focal length of the lens 32.

The ferrule 38 has a first end face 38a, second end face 38b, and a hole 38c extending from the first end face 38a to the second end face 38b in a direction of the axis 12. The resin coated on the optical fiber 40 is partly removed and then the resin-removed portion of the optical fiber 40 is inserted in the hole 38c. Preferably, the first and second end faces 38a and 38b are polished after the optical fiber 40 is inserted in the hole 38c. This polishing ensures that the ends of the optical fiber 40 appear at the respective end faces 38a and 38b.

The first end face 38b may be polished to form a first angle, e.g., substantially a right angle, with respect to the axis 12 of the optical semiconductor module 10. This end face 38b facilitates optical coupling between the optical fiber 40 and an optical fiber (in FIG. 1, an optical fiber 46 inserted in another ferrule 44) that is optically coupled to the semiconductor optical module 10. In more detail, for example, the ferrule 44 is polished to form a taper at one end 44a. By this polishing, the optical fiber 46 has an lensed end at the end 46a. A lensed end 46a can come into physical contact with the end face 38a of the ferrule 38.

The second end face 38c may be inclined at a second angle α, e.g., about an angle of 6 degrees, larger than an angle of 0 degree with respect to the axis 12 of the optical semiconductor module 10. The inclined end face 38c is useful to decrease the amount of light reflected from the second end face 38c of the ferrule 38 and returning to the optical semiconductor element 22.

Figure 2:
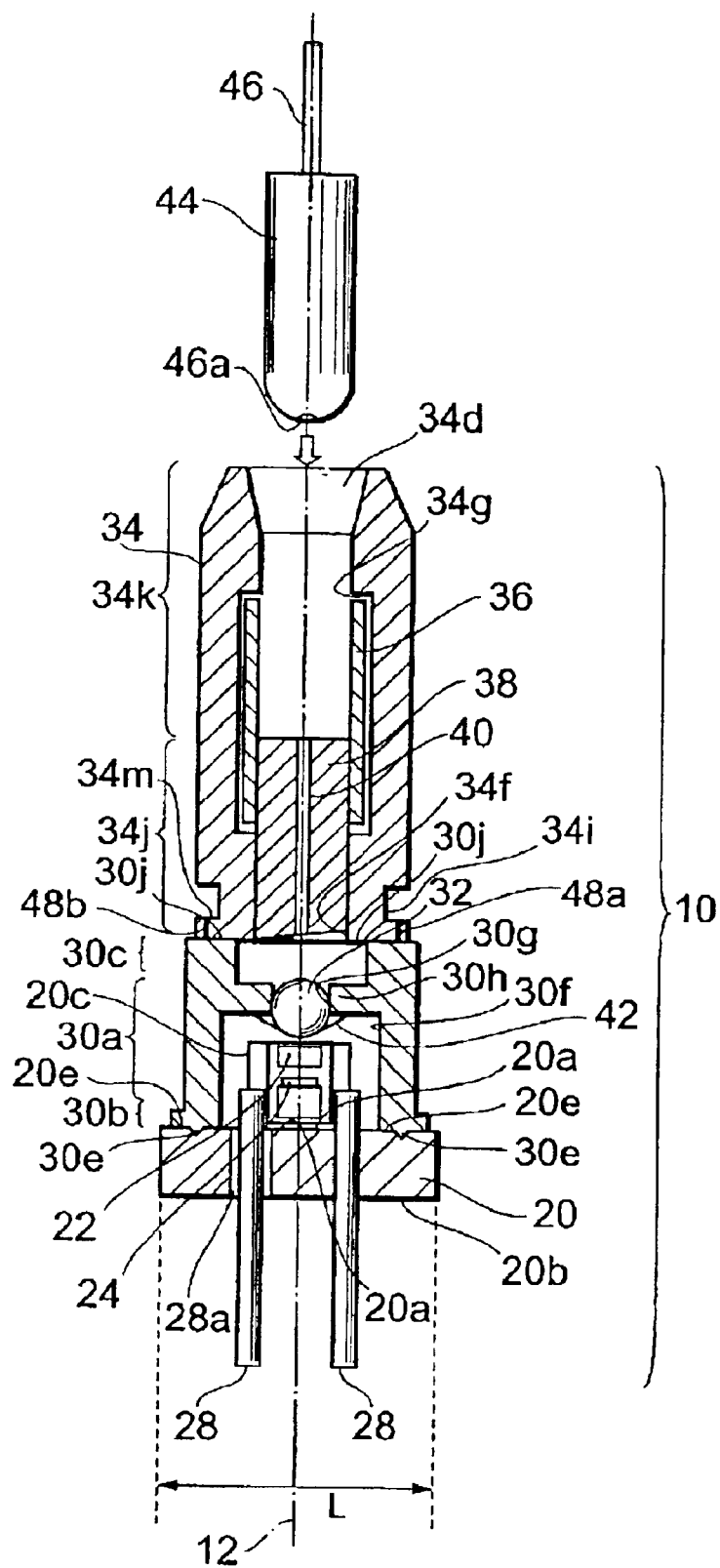
FIG. 2 is a sectional view of the optical semiconductor module according to the first embodiment of the present invention.

Referring to FIG. 2, the tubular portion 34a of the second member 34 has first and second portions 34j and 34k, which are adjacent to each other in a direction of the axis 12. The first portion 34j accommodates the ferrule 38. The second portion 34k is formed such that another ferrule (44 in FIG. 1) can be inserted in it. The other ferrule holds another optical fiber (40 in FIG. 1) that should be optically coupled to the optical fiber 40.

As described above in detail, the mounting member 20 is formed such that it is included in a cylindrical shape having a diameter L satisfying L≦4 mm and the center axis 12 perpendicular to the reference plane. Also, the mounting member 20, the first member and the second member 34 can be formed such that they are included in a cylindrical shape having a diameter L satisfying L≦4 mm and the center axis 12 perpendicular to the reference plane. In other words, an optical semiconductor module has been provided with a structure that can make the optical semiconductor module smaller.

(Second Embodiment)

An optical semiconductor module 14 according to another embodiment will be described with reference to FIGS. 3 and 4. The optical semiconductor module 14 has a mounting member 20, optical semiconductor element 22, first member 60, second member 64, and optical waveguide 70. The optical semiconductor module 14 can also have a condensing means, such as a lens 62, provided between the optical semiconductor element 22 and an optical waveguide 70. A ferrule 68 can be accommodated in the second member 64. The optical waveguide 70 may include an optical fiber supported by the ferrule 68. One end of the optical waveguide 70 is optically coupled to the optical semiconductor element 22, and the other end thereof reaches an optical connector plug 74. Furthermore, in the optical semiconductor module 14, the optical fiber 70 is inserted in the ferrule 68.

In the optical semiconductor module 14, the mounting member 20, the optical semiconductor element 22, the first member 60, the lens 62, the second member 64, a guide member 66, the ferrule 68, the optical waveguide 70, and the optical connector plug 74 are arranged in a direction of an axis 16. FIGS. 3 and 4 show the mounting member 20 identical with that shown in FIGS. 1 and 2, but the present invention is not limited thereto.

The first member 60 has a tubular portion 60a extending in a direction of the predetermined axis 16, a first end 60b provided at one end of the tubular portion 60a, and a second end 60c provided at the other end thereof. The first member 60 may be a member made of metal, such as stainless steel. The first end 60b has a securing surface 60d that comes into contact with the mounting member 20. The securing surface 60d has an annular projection 60e continuous to surround the axis 16 thereon. The first member 60 is secured to the mounting member 20 such that the securing surface 60d faces a contact surface 20e. This securing is carried out in a method similar to that of the first embodiment while obtaining the same advantages and functions as those of the first embodiment, but it is not limited thereto.

The tubular portion 60a has an inner wall surface 60f extending in a direction of the predetermined axis 16. The inner wall surface 60f has an annular projection 60h provided to support the lens 62. The projection 60h has a support surface 60g provided to support the lens 62. After the lens 62 is arranged in the tubular portion 60a and positioned by the projection 60h, the lens 62 is secured to the first member 60 through an adhering member 78 (FIG. 4). Hence, the light-emitting surface of the optical semiconductor element 22 faces the lens 62.

If the adhering member 78 (FIG. 4) is provided annularly to adhere the lens 62 to inner wall surface 60f, and it ensure the hermetical sealing at the adhering portion. The position of the projection 60h should be determined in consideration of the focal length of the lens 62 as well as the distance between the lens and the optical semiconductor element 20. The second end 60c has its end face 60j for supporting the second member 64.

When the first member 60 is secured on the mounting member 20, a part mounting surface 20a, the inner wall surface 60f, and the projection 60g define a region for accommodating the optical semiconductor element 22. Hence, the first member 60 serves as a housing or accommodating member. The annular projection 60e and adhering member 78 ensure the hermetical sealing of the accommodating space. The optical semiconductor module 14 is provided with a structure capable of reducing it in size because it does not contain any TO type CAN case.

The second member 64 has a tubular portion 64a extending in a direction of the predetermined axis 16. The second member 64 may be a sleeve made of stainless steel. At one end 64b of the tubular portion 64a, an opening for inserting the ferrule 38 therein is formed. At the other end 64c, an opening is provided such that light from the optical semiconductor element 22 passes therethrough. A flange is formed on the other end 64c.

The second member 64 has a securing surface 64e arranged so as to face the second end face 60j of the first member 60. The second member 64 is aligned with the first member 60 so that it can be aligned with the ferrule 68 that is to be inserted in the second member 64. The second member 64 is secured to the first member 60 at the securing surface 64e, but this securing is not limited thereto. The securing can be performed in the same manner as in the first embodiment, thereby obtaining the same functions and advantages as those of the first embodiment.

The second member 64 has an inner wall surface 64f extending is a direction of the axis 16. Hence, the inner wall surface 64f defines a region for accommodating the ferrule 68. The inner wall surface 64f comes into contact with theouter surface of the ferrule 68, thereby defining the inserting direction for the ferrule 68. The ferrule 68 is secured to the second member 64. Thus, this securing enables optical coupling between the optical waveguide 70, inserted in the ferrule 68, and the optical semiconductor element 22.

The ferrule 68 has a first end face 68a, second end face 68b, and hole 68c extending from the first end face 68a to the second end face 68b in a direction of the axis 16. The coating resin is stripped-off in a part of the coated optical fiber such that the stripped-off part can be inserted in the ferrule. The optical fiber 70 is inserted in the hole 68c. Preferably, the second end face 68b is polished after the optical fiber 70 is inserted in the hole 68c. This polishing facilitates an end 70a of the optical fiber 70 appear at the second end face 68b.

The second end face 68c may be inclined at a first angle β exceeding an angle 0 degree with respect to the axis 16 of the semiconductor module 14. A value almost equal to that in the first embodiment can be employed as the value of the first angle, whereby the same functions and advantages as those in the first embodiment are obtained, but the angle is not limited thereto.

The optical fiber 70 extends through the through hole 68c of the ferrule 68, and an accommodating portion 72a of a third member such as a protecting member 72. The protecting member 72 has the accommodating portion 72a extending in a direction of the predetermined axis 16. The accommodating portion 72a defines a tubular region having first and second openings. The second member 64 and the ferrule 68 with the optical waveguide 70 inserted therein both can be inserted in the accommodating portion 72a from a first opening 72e, and the optical fiber 70 can extend through a second opening 72f.

Figure 4:
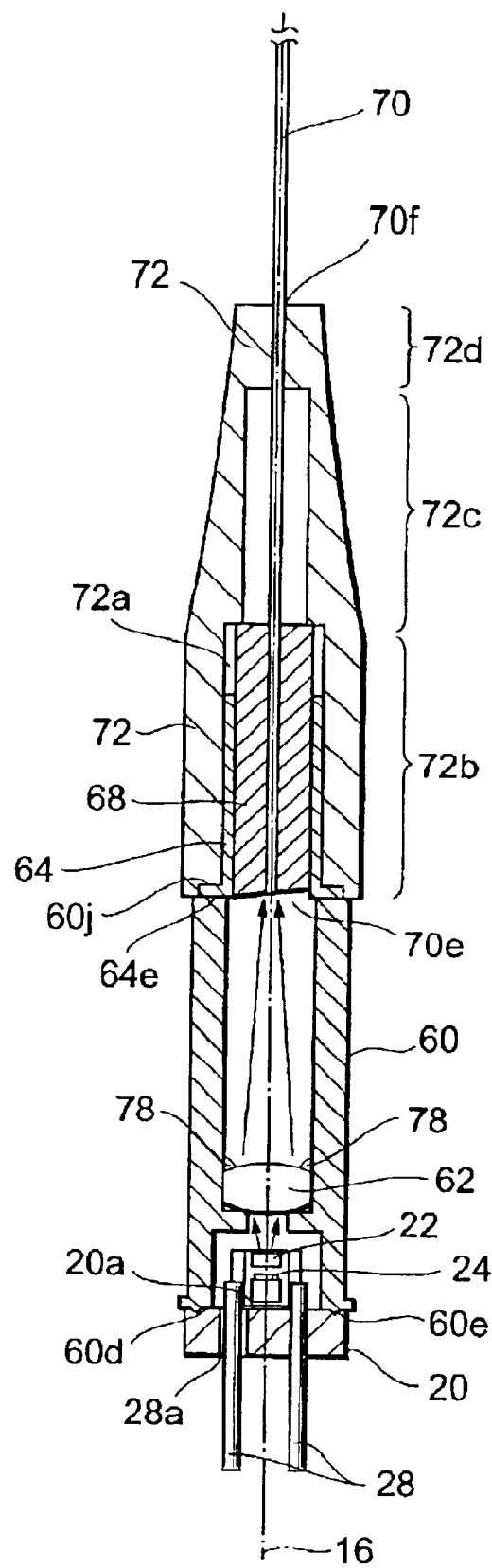
FIG. 4 is a sectional view of an optical semiconductor module according to the second embodiment of the present invention.

Referring to FIG. 4, the accommodating portion 72a of the protecting member 72 has a first portion 72b, second portion 72c and third portion 72d, which are arranged in a line and are adjacent to each other. The second member 64 and ferrule 68 are accommodated in the first portion 72b. The optical fiber 70 extends through the second portion 72c. The third portion 72d supports the optical fiber 70. The optical fiber 70 flexes in the second portion 72c so as to adjust its displacement between the protecting member 72 and ferrule 68.

The protecting member 72 is made of elastic material such as flame-retardant rubber. Hence, the protecting member 72 can accommodate the ferrule 68 and can moderate the bending force acting on the optical fiber 70. This protects the optical fiber 70.

Figure 3:
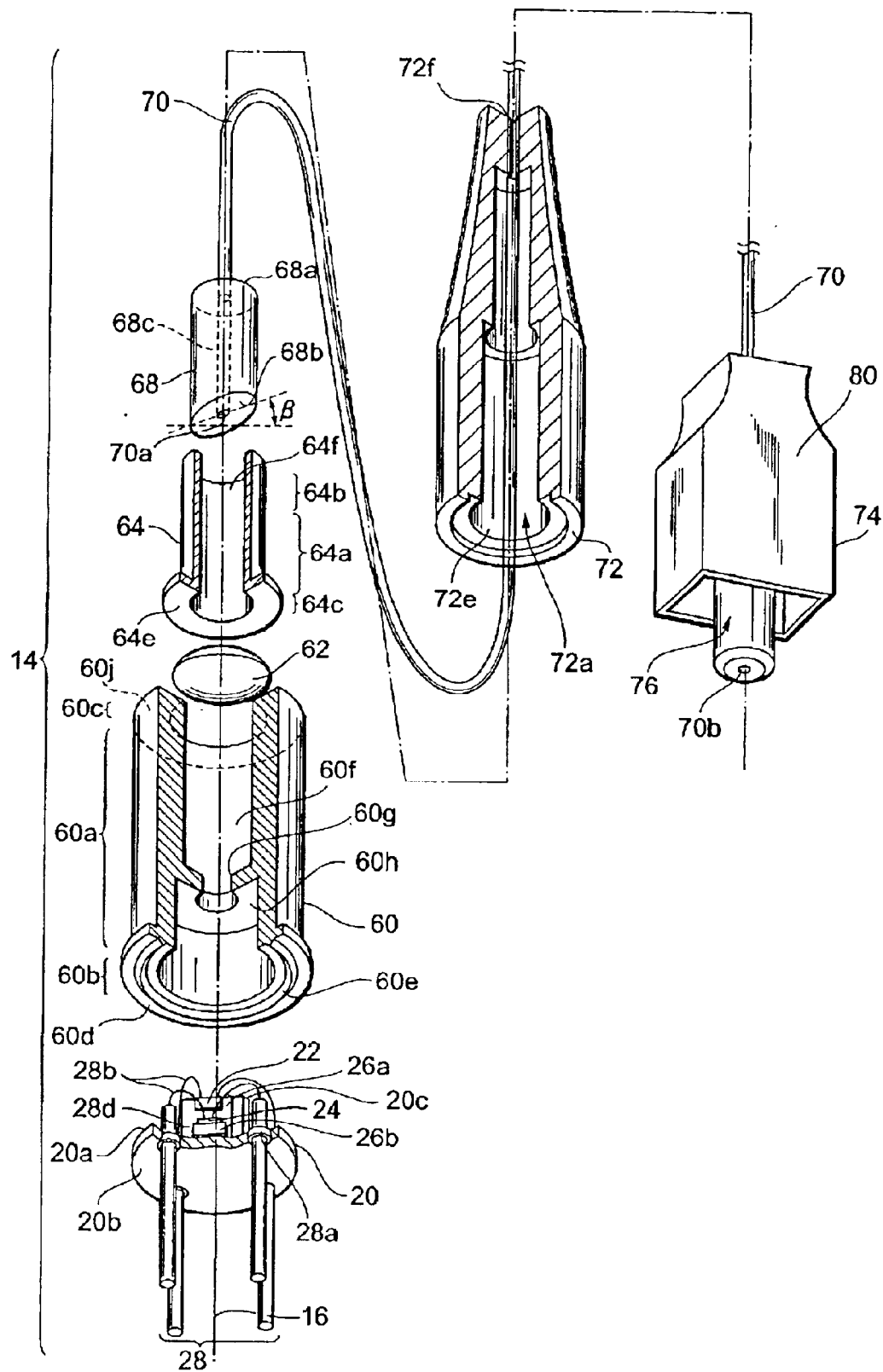
FIG. 3 is a perspective view of an optical semiconductor module according to the second embodiment of the present invention.

Referring to FIG. 3, the optical connector 74 is provided at the other end of the optical waveguide 70. The optical connector 74 has a housing 80 and a ferrule 76 secured to the housing. The housing 80 holds the ferrule 76 such that it extends in a direction of the predetermined axis 16. The other end 70b of the optical waveguide 70 appears at one end of the ferrule 76.

FIG. 4 shows a propagation path for light generated by the optical semiconductor element 22.

As described above in detail, according to this embodiment, the mounting member 20, first member 60, and second member 64 are formed such that they are included in a cylindrical shape having a diameter L satisfying $L \leq 4$ mm and the center axis 12. Therefore, optical semiconductor modules have been provided with structures capable of downsizing them.

Figure 5A:
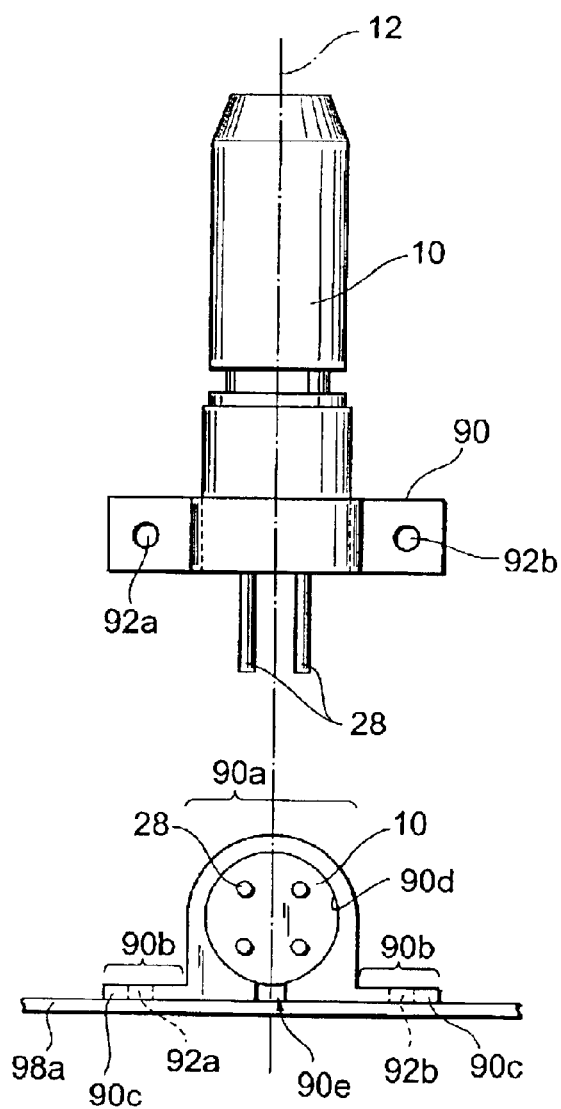
FIGS. 5A and 5B are views showing the relationship between a securing member and the optical semiconductor module.
Figure 5B:
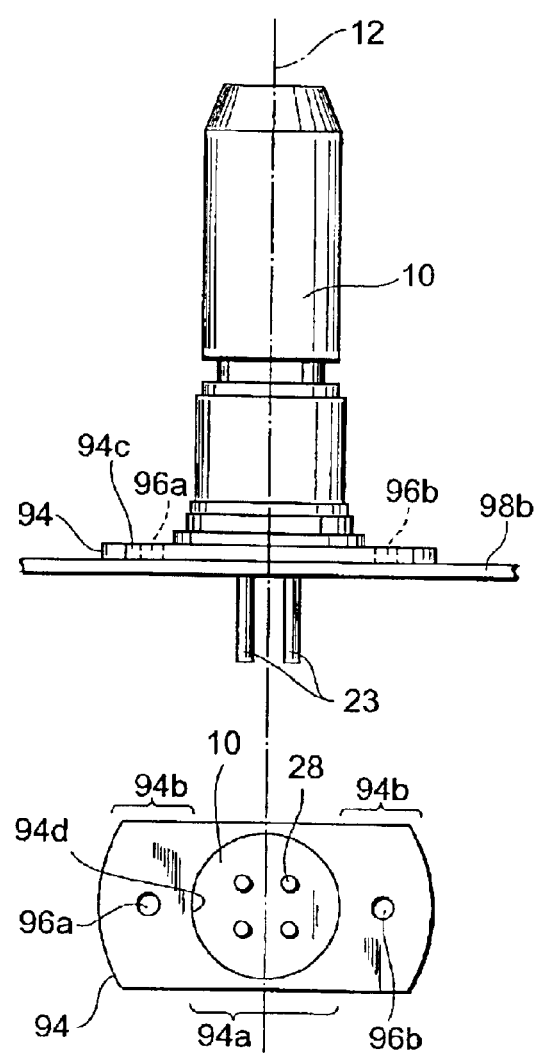
Figure 6:
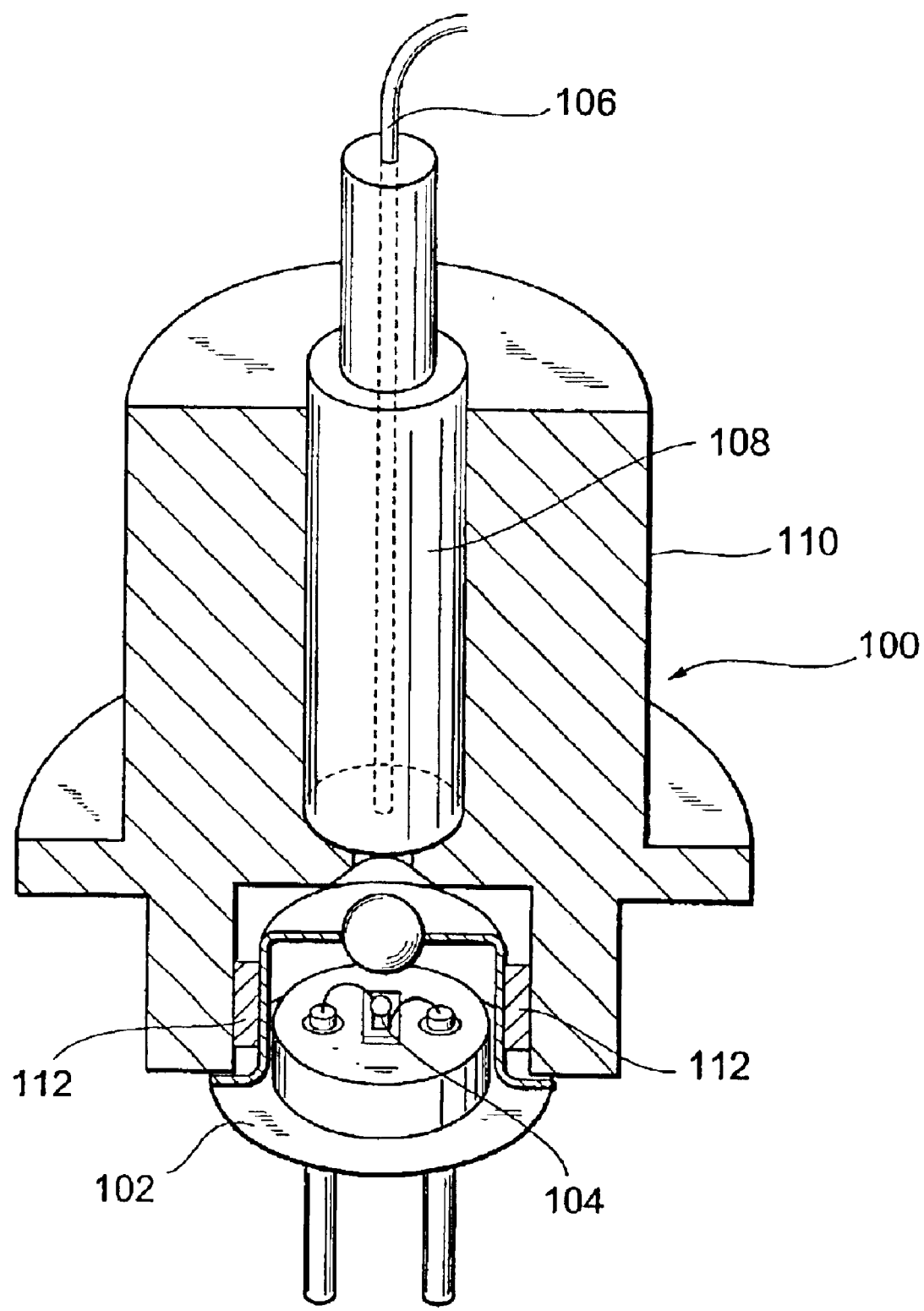
FIG. 6 is a view showing a conventional optical semiconductor module.

FIGS. 5A and 5B show securing members 90 and 94 for securing the optical semiconductor module 10 shown in the first embodiment to a wiring board. Explanation will be made in terms of the optical semiconductor module 10 shown in the first embodiment, but the semiconductor module 14 according to the second embodiment is used in place of that of the first embodiment as well.

Referring to FIG. 5A, the securing member 90 comprises a module support portion 90a having a half-annular shape and a pair of placement portions 90b. The module support portion 90a has a contact surface 90d surrounding the mounting member 20 of the optical semiconductor module 10, and supports the optical semiconductor module 10. The module support portion 90a has a notch 90e. The notch 90e enables the optical semiconductor module 10 to be easily inserted in the securing member 90. The placement portions 90b have contact surfaces 90c extending in a direction of the axis 12, and come into contact with a wiring board 98a. The placement portions 90b have a pair of holes 92a and 92b. The optical semiconductor module 10 is arranged such that the contact surface 90c of the fixing member 90 faces the wiring board 98a. In this arrangement, fixing components such as bolts are respectively inserted in the pair of holes 92a and 92b, and then fasten them. The optical semiconductor module 10 is arranged such that the axis 12 extends along the wiring board 98a.

Referring to FIG. 5B, the securing member 94 has an annular module support portion 94a and a pair of placement portions 94b. The module support portion 94a has a contact surface 94d for surrounding the mounting member 20 of the optical semiconductor module 10, and holds the optical semiconductor module 10. The placement portions 94b are formed to come into contact with a wiring board 98b, and have a contact surface 94c intersecting the axis 12 at a right angle, for example. The placement portions 94b have a pair of holes 96a and 96b. The optical semiconductor module 10 is arranged such that the contact surface 94c of the securing member 94 faces the wiring board 98b. With this arrangement, fixing components such as locking bolts and nuts are respectively inserted in the pair of holes 96a and 96b and fasten them. The optical semiconductor module 10 has been secured such that the axis 12 is directed in a direction intersecting the wiring board 98b, for example, in a direction perpendicular to the wiring board 98b.

Although the principle of the present invention has been described in the preferred embodiments thereof, it is recognized by a person skilled in the art that the present invention can be changed in its arrangements and details without departing from the principle. For example, the vertical and horizontal sizes of the respective components can be changed as required. Therefore, we claim all changes and modifications of the present invention without departing from the spirit and scope of the appended claims.

Industrial Applicability

As has been described above in detail, in the optical semiconductor module according to the present invention, since the tubular first member is placed on the mounting member, the mounting member and first member define a region for accommodating the optical semiconductor element. The second member defines a direction in which the optical waveguide extends. Since the second member is arranged at the second end of the first member, this arrangement determines the direction in which the optical waveguide and optical semiconductor element can be arranged to be optically coupled to each other. Since the first member defines the accommodating space for the optical semiconductor element, a support member does not need to be arranged outside a CAN case, unlike in the conventional optical semiconductor module. Therefore, an optical semiconductor module with a downsizeable structure was provided.

What is claimed is:

1. An optical semiconductor module comprising:

a mounting member, having an element mounting surface and a contacting surface, said element mounting surface and said contacting surface extending along a reference plane intersecting a predetermined axis, said element mounting surface and said contacting surface being substantially planar, and said mounting member being a plate-like member;

a first member having a tubular portion, a first end portion and a second end portion, said tubular portion extending in a direction of the predetermined axis, said first end portion being provided at one end of the tubular portion and being mounted on said contacting surface of the mounting member, said second end portion being provided at the other end of the tubular portion, said first end portion being bonded to said contacting surface of said mounting member, and an outer edge of said first end portion being located inside of an edge of said mounting member;

an optical semiconductor element provided in the tubular portion of said first member such that an optical axis thereof is directed in a direction of said predetermined axis, said optical semiconductor element being mounted in said element mounting surface;

a second member having a tubular portion extending in a direction of the predetermined axis, said second member being mounted on the second end of said first member;

an optical fiber optically coupled to said optical semiconductor element, said optical fiber extending in the tubular portion of said second member; and a lens held by said first member, said lens being provided between said optical fiber and said optical semiconductor element.

2. An optical semiconductor module according to claim 1, further comprising a ferrule accommodated in the tubular portion of said second member, wherein said optical fiber is supported by said ferrule.

3. An optical semiconductor module according to claim 2, wherein said ferrule has first and second end faces, and the optical fiber extends from the first end face to the second end face of said ferrule.

4. An optical semiconductor module according to claim 3, further comprising a sleeve, said ferrule is inserted in said sleeve;

wherein said second member has a depressed portion provided in an inner wall surface of the tubular portion, and wherein said sleeve is arranged in the depressed portion of said second member.

5. An optical semiconductor module according to claim 3, wherein the tubular portion of said second member has first and second portions arranged in a direction of the predetermined axis, wherein the first portion accommodates said ferrule, and wherein the second portion is provided such that another ferrule can be inserted therein.

6. An optical semiconductor module according to claim 1, wherein said optical semiconductor element is a light-emitting element or a light-receiving element.

7. An optical semiconductor module according to claim 1, wherein said first member is secured to said mounting member at an annular connecting portion to secure said optical semiconductor element.

8. An optical semiconductor module according to claim 1, wherein said mounting member is included in a cylindrical shape having a diameter of not more than 4 mm and a center axis perpendicular to the reference plane.

9. An optical semiconductor module according to claim 3,
wherein the tubular portion of said second member has first and second portions arranged in a direction of the predetermined axis,
wherein the first portion accommodates said ferrule, and
wherein the second portion is provided such that another ferrule can be inserted therein.

10. An optical semiconductor module according to claim 3, further comprising a sleeve, said ferrule is inserted in said sleeve;
wherein said tubular portion of said second member has first to third portions sequentially arranged in said predetermined axis;
wherein said second member has a depressed portion provided in an inner wall surface of said second portion thereof,
wherein said sleeve is provided in the depressed portion of said second member, and
wherein said inner diameter of said second portion is greater than inner diameters of said first and third portions.

11. An optical semiconductor module according to claim 3,
wherein the tubular portion of said second member has first and second portions arranged in a direction of the predetermined axis,
wherein the first portion accommodates said ferrule, and
wherein the second portion is provided such that another ferrule can be inserted therein.

12. An optical semiconductor module according to claim 1, wherein said first member is resistance-welded to said mounting member at an annular connecting portion to secure said optical semiconductor element.

13. An optical semiconductor module according to claim 1,
wherein said mounting member includes a terminal electrode having a side surface extending in a direction of said predetermined axis;
wherein said terminal electrode is connected to said optical semiconductor element;
wherein said first member includes an inner wall surface extending in said direction of said predetermined axis; and
wherein said inner wall surface faces said side surface of said terminal electrode.

14. An optical semiconductor module according to claim 1,
wherein said mounting member includes a terminal electrode connected to said optical semiconductor element;
wherein said terminal electrode has an inner portion projecting from said reference plane in a direction of said predetermined axis; and
wherein said tubular portion of said first member surrounds said inner portion of said terminal electrode.

* * * * *